United States Patent
Yun et al.

(10) Patent No.: US 10,312,935 B2
(45) Date of Patent: Jun. 4, 2019

(54) DIGITAL DATA COMPRESSION AND DECOMPRESSION DEVICE

(71) Applicant: SOLiD, INC., Seongnam-si, Gyeonggi-do (KR)

(72) Inventors: Hee Cheol Yun, Seoul (KR); Seung Rog Choi, Seongnam-si (KR); Sun Keun Yu, Seoul (KR); Tae Hyeong Kim, Anyang-si (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 15/757,590

(22) PCT Filed: Mar. 7, 2016

(86) PCT No.: PCT/KR2016/002243
§ 371 (c)(1),
(2) Date: Mar. 5, 2018

(87) PCT Pub. No.: WO2017/039095
PCT Pub. Date: Mar. 9, 2017

(65) Prior Publication Data
US 2018/0262206 A1    Sep. 13, 2018

(30) Foreign Application Priority Data
Sep. 3, 2015    (KR) .................. 10-2015-0125037

(51) Int. Cl.
| H03M 7/30 | (2006.01) |
| H04L 1/00 | (2006.01) |
| H04L 27/26 | (2006.01) |
| H04B 10/516 | (2013.01) |
| H04B 10/2575 | (2013.01) |

(52) U.S. Cl.
CPC .............. *H03M 7/30* (2013.01); *H03M 7/70* (2013.01); *H04B 10/516* (2013.01); *H04L 1/0013* (2013.01); *H04L 27/2634* (2013.01); *H04B 10/2575* (2013.01)

(58) Field of Classification Search
CPC .... H03M 7/30; H04L 1/0013; H04L 27/2634; H04B 10/516
USPC ............................................ 341/50
See application file for complete search history.

(56) References Cited

U.S. PATENT DOCUMENTS

| 6,074,086 A | 6/2000 | Yonge, III | |
| 6,246,729 B1 * | 6/2001 | Richardson | H04L 27/22 329/345 |

(Continued)

OTHER PUBLICATIONS

International Search Report for PCT/KR2016/002243 dated Jul. 1, 2016.

*Primary Examiner* — Khai M Nguyen
(74) *Attorney, Agent, or Firm* — Sughrue Mion, PLLC

(57) ABSTRACT

There is provided a digital data compression device including a domain converter configured to perform frequency domain conversion on input digital I/Q data and output coefficient data corresponding to the digital I/Q data; a data converter configured to receive the coefficient data output from the domain converter and convert the input coefficient data of Cartesian coordinates into coefficient data of polar coordinates; and a quantizer configured to quantize the coefficient data of the polar coordinates output from the data converter.

5 Claims, 5 Drawing Sheets

(56) References Cited

U.S. PATENT DOCUMENTS

| | | | |
|---|---|---|---|
| 6,714,154 B2* | 3/2004 | Cirillo | G01S 7/295 |
| | | | 341/50 |
| 7,298,841 B2* | 11/2007 | Sewell | G06T 1/0028 |
| | | | 380/210 |
| 9,118,401 B1* | 8/2015 | Nieto | H04B 1/1036 |
| 2009/0018824 A1* | 1/2009 | Teo | G10L 19/0212 |
| | | | 704/203 |
| 2010/0172233 A1 | 7/2010 | Bianchi et al. | |
| 2011/0013714 A1 | 1/2011 | Tamaki et al. | |

* cited by examiner

DIGITAL DATA COMPRESSION AND DECOMPRESSION DEVICE

CROSS-REFERENCE TO RELATED APPLICATIONS

This application is a National Stage of International Application No. PCT/KR2016/002243, filed Mar. 7, 2016, and claims priority from Korean Patent Application No. 10-2015-0125037, filed Sep. 3, 2015, the contents of which are incorporated herein by reference in their entireties.

BACKGROUND

1. Field

The inventive concept relates to compression and decompression of digital data, and more particularly, to a digital data compression and decompression device for transmission of a digitized radio frequency signal.

2. Description of the Related Art

When an analog signal such as a radio frequency signal of a mobile communication is to be digitally transmitted through a transmission medium such as an optical line, an original analog signal is converted into digital data and then transmitted. The transmission speed is limited according to a transmission line. Therefore, when a radio frequency signal is transmitted through a digital transmission line having a limited transmission speed, the number of channels that can be transmitted may be limited. Therefore, when converting a radio frequency signal into digital data, there is a need for a technique for increasing transmission efficiency so that the amount of data to be transmitted may be minimized.

SUMMARY

A digital data compression and decompression method according to the inventive concept and a device to which the digital data compression and decompression method is applied are directed to increase transmission efficiency when a radio frequency signal is converted into digital data and transmitted through a transmission medium.

According to an aspect of the inventive concept, a digital data compression device includes a domain converter configured to perform frequency domain conversion on input digital I/Q data and output coefficient data corresponding to the digital I/Q data; a data converter configured to receive the coefficient data output from the domain converter, and convert the input coefficient data of Cartesian coordinates into coefficient data of polar coordinates; and a quantizer configured to quantize the coefficient data of the polar coordinates output from the data converter.

In an example embodiment, the digital data compression device may further include a signal rate adjuster disposed at a front end of the domain converter based on a transmission path of digital data and configured to decrease a signal rate of digital I/Q data to be input to the domain converter.

In an example embodiment, the domain converter may be implemented by a fast fourier transform (FFT) block, and the coefficient data is an FFT coefficient by the FFT block.

In an example embodiment, the quantizer may be configured to generate a quantization value by performing a linear quantization operation of a fixed point on angle component data among coefficient data output from the data converter, and generate a quantization value by performing a floating point quantization operation on magnitude component data among coefficient data output from the data converter.

According to another aspect of the inventive concept, a digital data decompression device includes a dequantizer configured to perform dequantization on coefficient data of polar coordinates input with quantization; a data converter configured to receive coefficient data of polar coordinates output from the dequantizer, and convert the received coefficient data of the polar coordinates into coefficient data of Cartesian coordinates; and a domain inverse converter configured to receive coefficient data of Cartesian coordinates output from the data converter, and perform frequency domain inverse conversion on the received coefficient data to output digital I/Q data in a time domain.

In an example embodiment, the domain inverse converter may be implemented as an inverse FFT (IFFT) block.

In an example embodiment, the digital data decompression device may further include a signal rate adjuster disposed at a rear end of the domain inverse converter based on a transmission path of digital data and configured to increase a signal rate of the digital I/Q data output from the domain inverse converter.

According to another aspect of the inventive concept, a digital signal repeater includes the digital data compression device and the digital data decompression device, and configured to process digital data in a standard digital format transmitted from base station equipment through a transmission line or digital data in a standard digital format transmitted from remote radio equipment through a transmission line.

A digital data compression method and a digital data decompression method according to embodiments of the inventive concept may increase transmission efficiency when a radio frequency signal is converted into digital data and transmitted through a transmission medium.

Specific effects of the digital data compression method and the digital data decompression method according to embodiments of the inventive concept will be more clearly understood from the following description.

BRIEF DESCRIPTION OF THE FIGURES

A brief description of each drawing is provided to more fully understand drawings recited in the detailed description of the inventive concept.

DETAILED DESCRIPTION OF EXEMPLARY EMBODIMENTS

Figure 1:
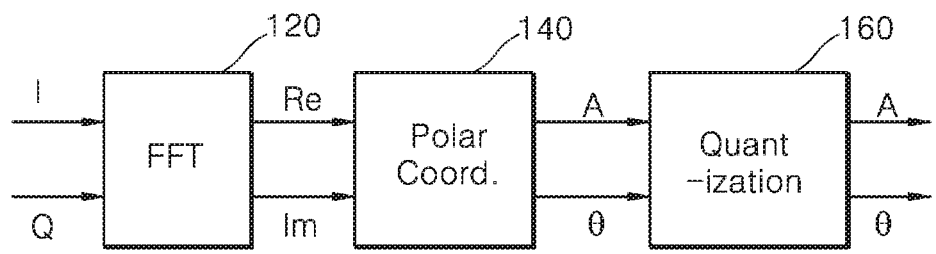
FIG. 1 is a block diagram of a digital data compression device and a digital data decompression device according to an embodiment of the inventive concept.
Figure 1:
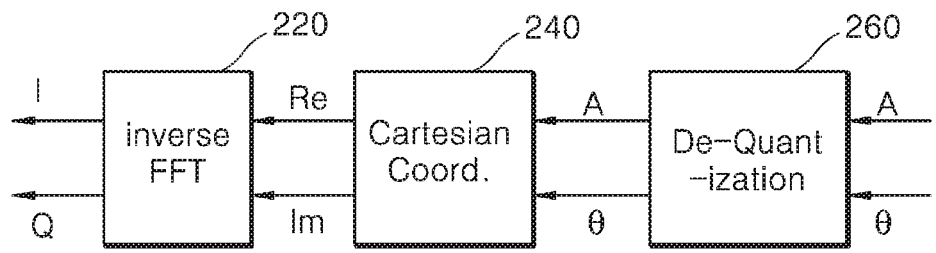

As the inventive concept allows for various changes and numerous embodiments, embodiments will be illustrated in the drawings and described in detail in the written description. However, this does not limit the inventive concept to specific example embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification are just identification symbols for distinguishing one element from another element.

Further, in the specification, if it is described that one element is "connected" or "accesses" the other element, it is understood that the one element may be directly connected to or may directly access the other element but unless explicitly described to the contrary, another element may be "connected" or "access" between the elements. In addition, it will be understood that when a unit is referred to as "comprising" another element, it may not exclude the other element but may further include the other element unless specifically oppositely indicated.

Reference will now be made in detail to embodiments, examples of which are illustrated in the accompanying drawings.

FIG. 1 is a block diagram of a digital data compression device and a digital data decompression device according to an embodiment of the inventive concept. Hereinafter, the inventive concept will be described with reference to the embodiment shown in FIG. 1, but other embodiments and applications will be described with reference to FIGS. 2 to 4.

Figure 2:
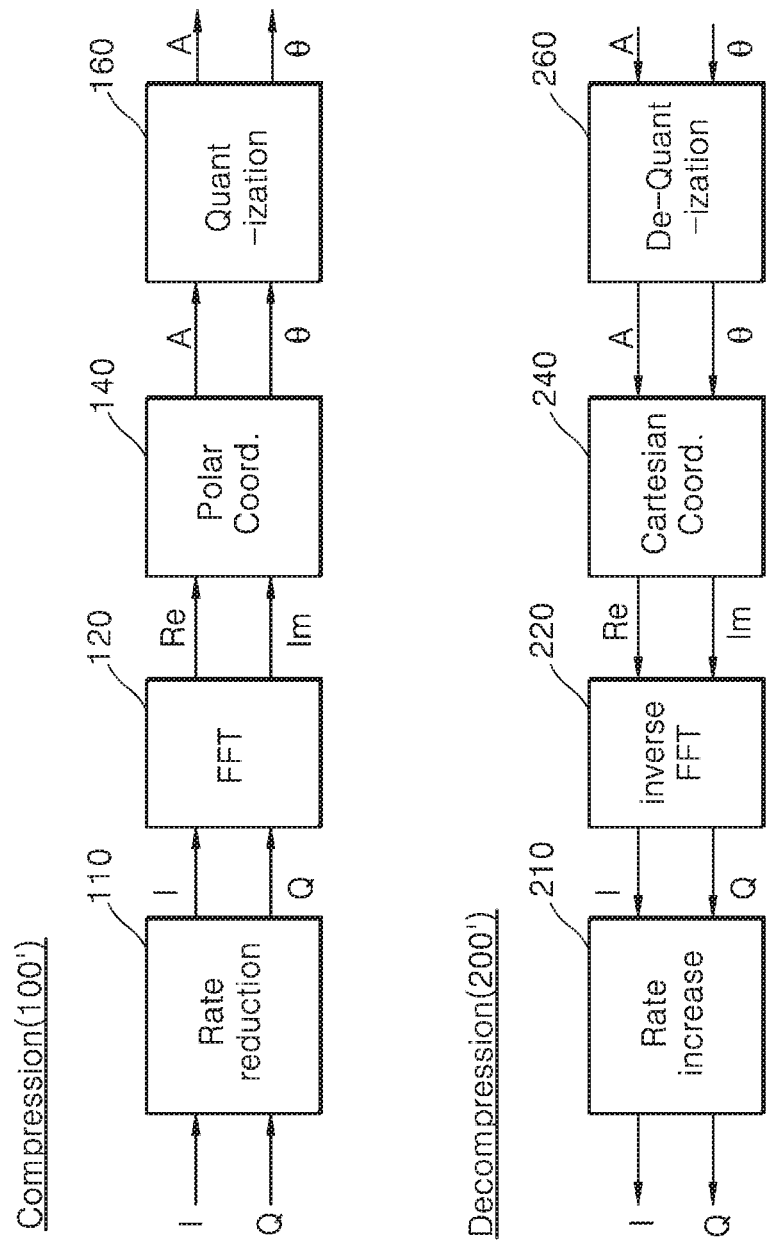
FIG. 2 is a block diagram of a digital data compression device and a digital data decompression device according to another embodiment of the inventive concept.
Figure 3:
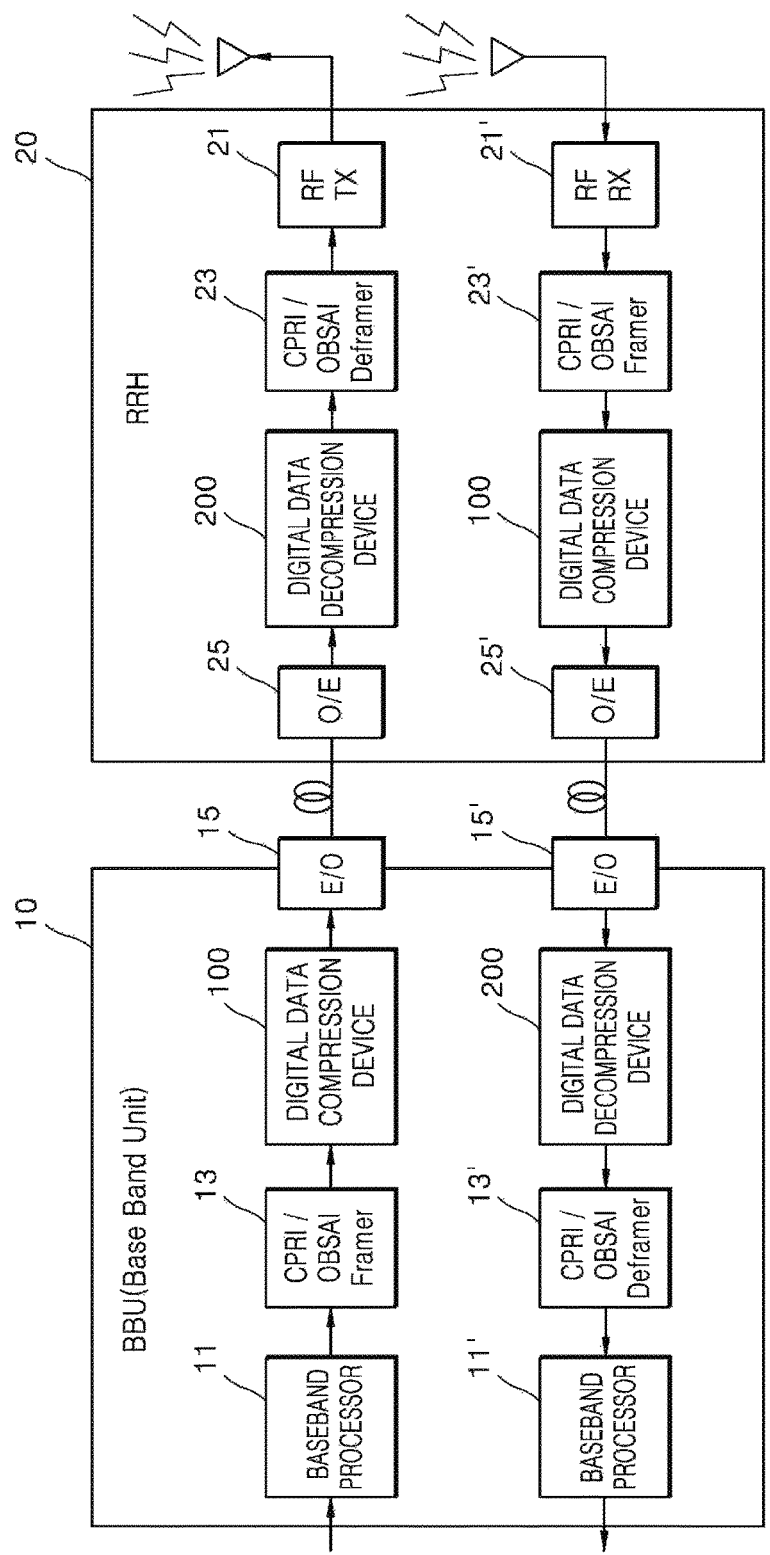
FIG. 3 is a view of an application of a digital data compression and decompression device according to an embodiment of the inventive concept.
Figure 4:
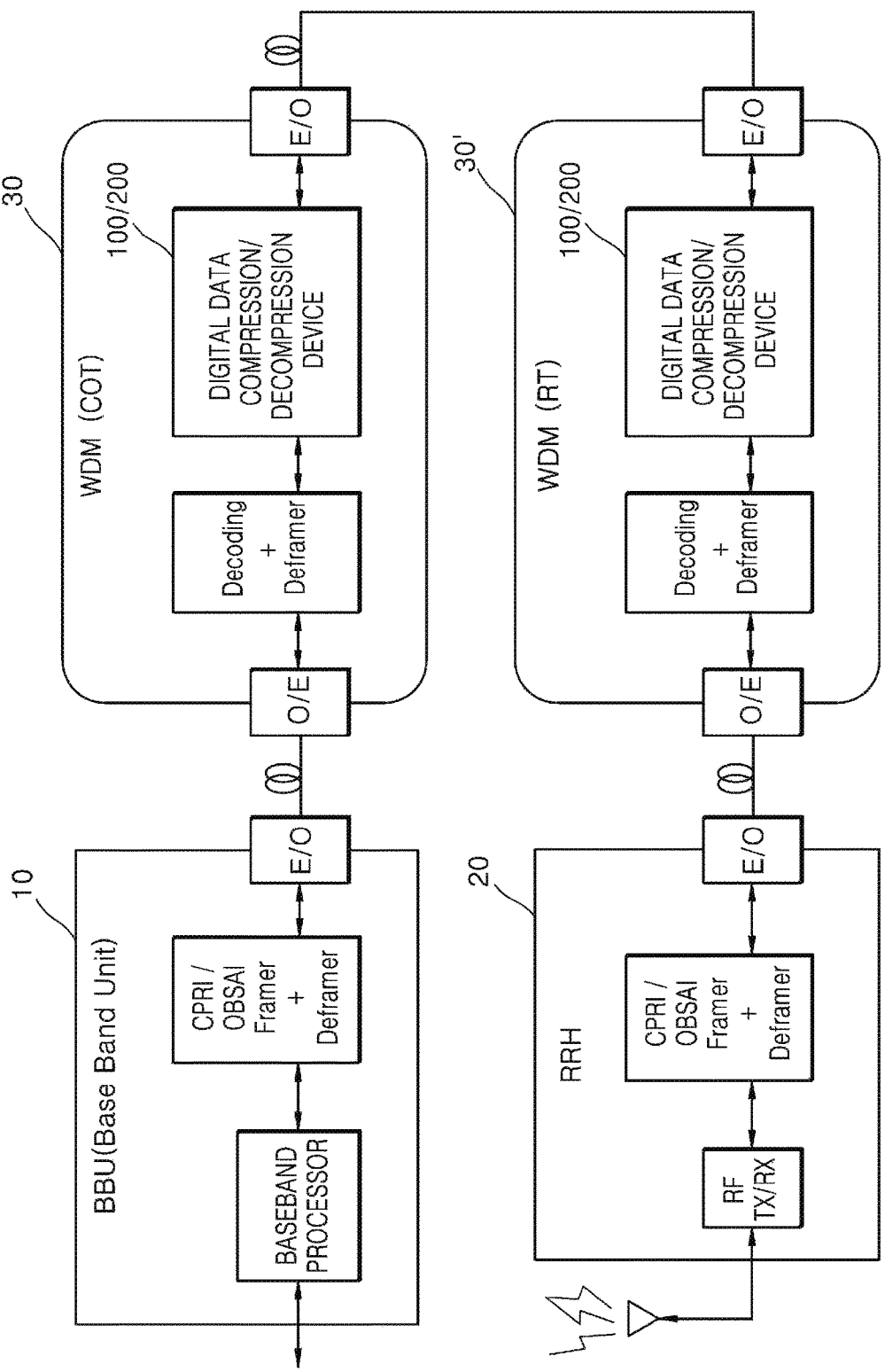
FIG. 4 is a view of another application of a digital data compression and decompression device according to an embodiment of the inventive concept.

FIG. 2 is a block diagram of a digital data compression device and a digital data decompression device according to another embodiment of the inventive concept, FIG. 3 is a view of an application of a digital data compression and decompression device according to an embodiment of the inventive concept, and FIG. 4 is a view of another application of a digital data compression and decompression device according to an embodiment of the inventive concept.

Referring to FIG. 1, a digital data compression device 100 according to an embodiment of the inventive concept includes a domain converter 120, a data converter 140, and a quantizer 160. Furthermore, a digital data decompression device 200 according to an embodiment of the inventive concept includes a dequantizer 260, a data converter 240, and a domain inverse converter 220.

The domain converter 120 of the digital data compression device 100 performs frequency domain conversion on input digital I/Q data. Accordingly, the domain converter 120 generates and outputs coefficient data corresponding to the input digital I/Q data.

The domain converter 120 may be implemented as a fast fourier transform (FFT) block as shown in FIG. 1. Coefficient data generated and output by the domain converter 120 may be an FFT coefficient of an FFT block unit with respect to the input digital I/Q data.

As described above, the basic concept of the inventive concept is receiving digital I/Q data generated after an original analog radio frequency signal is analog-to-digital (ADC) converted, converting the digital I/Q data into a signal of a frequency domain, and compressing and transmitting a coefficient of the signal. Since a characteristic of a signal in a frequency domain is shown as a result of FFT conversion, the inventive concept has an advantage of being able to optimize a frequency characteristic of a decompressed signal unlike the conventional method of compressing a signal in a time domain.

In general, when a compressed radio frequency signal is finally decompressed to an analog signal, a difference relative to the original signal occurs. Such an error signal is represented in the form of flat white noise in a spectral region. The level of compression noise increases as the degree of compression increases. In the case of a frequency division method such as long term evolution (LTE), the compression noise may increase beyond a thermal noise level of a receiver in a non-signal band. In the case of an uplink signal, a plurality of compressed signals in the same band are transmitted and added to each other. Here, when a non-signal band of a certain channel includes a signal of another channel, the certain channel may be affected by noise due to compression.

However, in the embodiment of the inventive concept, a quantization process (see the quantizer 160 in FIG. 1) in a frequency domain using frequency domain-converted coefficient data is performed. Therefore, since the level of noise due to compression is optimized in a non-signal band, interference with other channels due to compression noise as in the prior art may be minimized.

The data converter 140 of the digital data compression device 100 receives the coefficient data output from the domain converter 120 and converts the coefficient data into coefficient data of polar coordinates. Basically, the coefficient data generated by the domain converter 120 is a value having a real part and an imaginary part of Cartesian coordinates. The data converter 140 converts the coefficient data of the Cartesian coordinates into data of the polar coordinates of a magnitude component and an angle component.

Since the magnitude component of the coefficient data converted to the polar coordinates always has a positive value, the number of bits used for representing a corresponding coefficient value as digital data may be reduced in a future quantization process as compared with coefficient data of the Cartesian coordinates that can be represented as a negative number. In addition, the angle component of the coefficient data converted into the polar coordinates may also be represented not only as a limited numerical value within a range of +180 to −180 degrees but also as uniform distribution throughout signals. Thus, there is an advantage in the quantization process as compared with coefficient data of the existing Cartesian coordinates.

The coefficient data of the magnitude component and the angle component which is converted into the polar coordinates through the above-described process is input to the quantizer 160 of the digital data compression device 100 and is quantized.

In order to improve quantization efficiency, in the case of the data of the angle component, a linear quantization operation of a fixed-point is performed to generate a quantized value, and a floating-point quantization operation is performed on the data of the magnitude component to generate a quantized value. The linear quantization operation of the fixed point may also be performed on the data of the magnitude component. However, when the floating-point quantization operation is performed on the data of the magnitude component, the degree of improvement of a signal-to-noise ratio (SNR) is remarkably increased with respect to a frequency component having a lower power level.

When quantized coefficient data is transmitted through the transmission line according to the above-described process, the amount of data to be transmitted may be greatly reduced and transmission efficiency may be increased as compared with the conventional method (e.g., one of the standard digital transmission standard formats CPRI, OBSAI, ORI, etc.) in which digital data is digitally transmitted through a transmission line by merely adjusting a signal rate.

When quantized coefficient data of polar coordinates is transmitted in the above-described manner, the digital data decompression device 200 decompresses the quantized coefficient data to its original state. That is, referring to FIG. 1, the dequantizer 260 of the digital data decompression device 200 performs dequantization with respect to the input quantized coefficient data of the polar coordinates. The data converter 240 of the digital data decompression device 200 converts coefficient data of the polar coordinates output from the dequantizer 260 into coefficient data of the Cartesian coordinates, and the domain inverse converter 220 inversely converts (that is, conversion into a digital signal in a time domain) a frequency domain with respect to the coefficient data of the Cartesian coordinates output from the data converter 240. The domain inverse converter 220 may be implemented with an inverse conversion block (inverse FFT (IFFT) in FIG. 1) which is matched with an implementation block (i.e., the FFT block in FIG. 1) of the domain converter 120.

Although the description has been made with reference to FIG. 1, according to another embodiment, the digital data compression device and the digital data decompression device may be implemented as shown in FIG. 2. Referring to FIG. 2, a digital data compression device 100' and a digital data decompression device 200' further include signal rate adjusters 110' and 210', respectively, as compared with the configuration of FIG. 1.

In the digital data compression device 100' of FIG. 2, the signal rate adjuster 110 is located at a front end of the domain converter 120 based on a digital data transmission path (that is, based on a downlink signal transmission path) and reduces a signal rate of digital I/Q data to be input to the domain converter 120. For example, a signal rate of a digital signal according to the CPRI standard is 30.72 MHz and this may need to be adjusted to match a signal rate of a system being applied. The signal rate adjuster 110 may perform the adjustment. As another example, in the case of the CPRI standard, redundancy is significant in a data format. Therefore, it is possible to reconfigure only necessary data except for the redundancy and the signal rate adjuster 110 may also perform the reconfiguration. For example, the signal rate adjuster 110 may reduce the signal rate of 30.72 MHz to 20.48 MHz by ⅔, which is a signal rate of a distributed antenna system.

When the signal rate adjustment is performed as described above, the digital data decompression device 200' may further include the signal rate adjuster 210' for decompressing a signal rate to a normal state at a rear end of the domain converter 220 based on a digital data transmission path (that is, an uplink signal transmission path).

The digital data compression device and the digital data decompression device described above may be separately or integrally applied to a digital data signal transmission process. Applications for this are illustrated in FIGS. 3 and 4.

FIGS. 3 and 4 illustrate base station distribution systems and show cases where the digital data compression device 100 and the digital data decompression device 200 of FIG. 1 are applied to the base station distribution systems, respectively.

FIG. 3 illustrates a case where the digital data compression device 100 and the digital data decompression device 200 are directly applied to a baseband unit (BBU) 10 and a remote radio head (RRH) 20 of a base station, respectively.

In FIG. 3, the digital data compression device 100 in the BBU 10 performs data compression on data processed in a digital standard format through a CPRI or OBSAI framer 13 from a baseband processor 11, and performs digital optical transmission through an electro-optical converter 15. Accordingly, a digital optically transmitted signal is input to the digital data decompression device 200 after passing through an electro-optical converter 25 of the RRH 20, standard formatted through the CPRI or OBSAI deframer 23, converted into an original radio frequency signal by an RF processor 21, and transmitted to the outside through an antenna. Uplink signal processing will be performed in the reverse order of signal processing in the above-described downlink signal path (see reference numerals 21'→23'→100→25'→15'→200→13'→11' in FIG. 3).

Unlike the above description, FIG. 4 illustrates a case in which a digital data compression/decompression integrated device is mounted in a separate wavelength division multiplexing (WDM) device (i.e., a central office terminal (COT) 30 and a remote terminal (RT) 30') installed at a location adjacent to the BBU 10 and adjacent to the RRH 20 separately from the BBU 10 and the RRH 20.

In addition, digital data compression devices and digital data decompression devices according to embodiments of the inventive concept may be applied to various applications requiring digital data transmission.

Figure 5A:
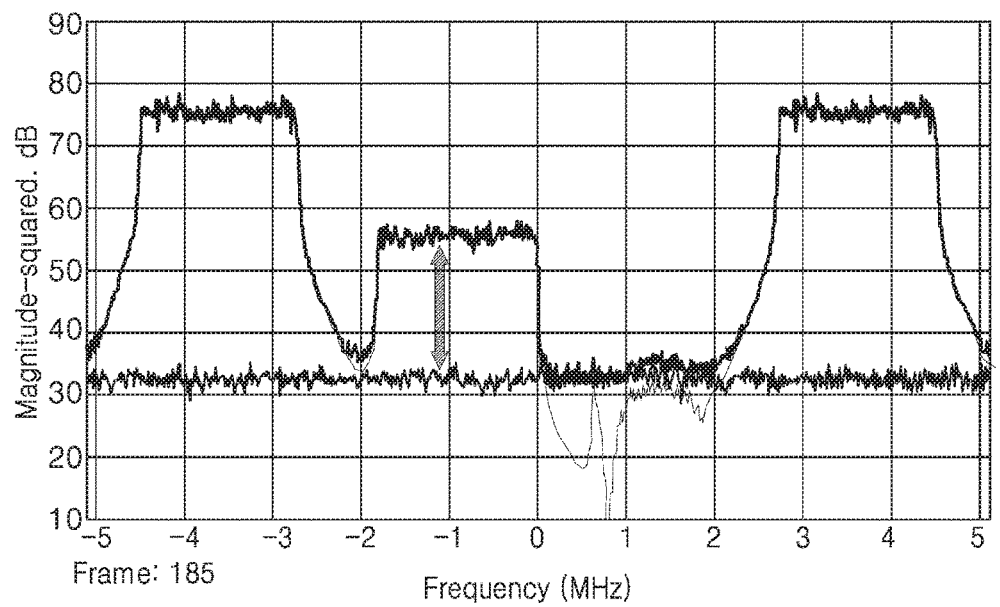
FIGS. 5A and 5B are graphs of an experimental example comparing the performance of a digital data compression method according to an embodiment of the inventive concept with the performance of a conventional method.
Figure 5B:
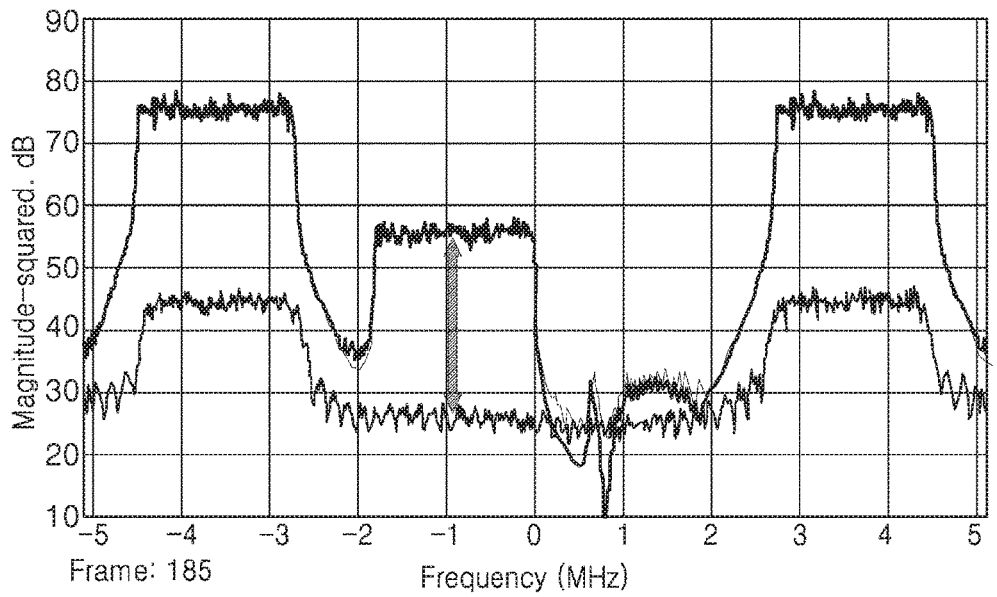

FIGS. 5A and 5B are graphs of an experimental example comparing the performance of a digital data compression method according to an embodiment of the inventive concept with the performance of a conventional method. FIG. 5A is experimental data showing a case in which 3:1 ratio digital data compression is performed in a time domain according to the conventional method, and FIG. 5B is experimental data showing a case in which 3:1 ratio digital data compression is performed according to an embodiment of the inventive concept, and frequency domain conversion and quantization of coefficient data in polar coordinates are further performed.

Also, in the experimental example, each digital I/Q data is represented by 7 bits in the conventional method of FIG. 5A. In FIG. 5A, a magnitude component in the polar coordinates is represented by 5 bits and an angle component of the polar coordinates is represented by 2 bits, and floating point quantization is performed in the quantization process. In this case, according to the compression method according to the embodiment of the inventive concept shown in FIG. 5B, when signals of various channels are superimposed, it can be seen that an SNR due to compression of signals having a lower power level is improved by about 10 dB as compared with the conventional method shown in FIG. 5A.

While the embodiments have been particularly shown and described, it will be understood by those of ordinary skill in the art that various changes in form and details may be made therein without departing from the scope of the inventive concept as defined by the appended claims.

The invention claimed is:

1. A digital data compression device comprising:
   a signal rate adjuster configured to output adjusted digital I/Q data by adjusting a signal rate of input digital I/Q data;
   a domain converter configured to perform frequency domain conversion on the adjusted digital I/Q data and output coefficient data corresponding to the adjusted digital I/Q data;

a data converter configured to receive the coefficient data output from the domain converter, and convert the received coefficient data from coefficient data of Cartesian coordinates into coefficient data of polar coordinates; and a quantizer configured to quantize the coefficient data of the polar coordinates output from the data converter.

2. The digital data compression device of claim 1, wherein the domain converter is implemented by a fast fourier transform (FFT) block, and the coefficient data is an FFT coefficient by the FFT block.

3. The digital data compression device of claim 1, wherein the quantizer is configured to generate a quantization value by performing a linear quantization operation of a fixed point on angle component data among coefficient data output from the data converter, and generate a quantization value by performing a floating point quantization operation on magnitude component data among coefficient data output from the data converter.

4. A digital data decompression device comprising:

a dequantizer configured to perform dequantization on coefficient data of polar coordinates input with quantization;

a data converter configured to receive coefficient data of polar coordinates output from the dequantizer, and convert the coefficient data of the polar coordinates into coefficient data of Cartesian coordinates; and a domain inverse converter configured to receive coefficient data of Cartesian coordinates output from the data converter, and perform frequency domain inverse conversion on the coefficient data to output digital I/Q data in a time domain, a signal rate adjuster configured to adjust a signal rate of the digital I/Q data output from the domain inverse converter.

5. The digital data decompression device of claim 4, wherein the domain inverse converter is implemented as an inverse FFT (IFFT) block.

* * * * *